United States Patent
Nagahara

(10) Patent No.: US 10,133,163 B2
(45) Date of Patent: Nov. 20, 2018

(54) LIGHT SOURCE UNIT AND OPTICAL ENGINE

(71) Applicant: Nichia Corporation, Anan-shi (JP)

(72) Inventor: Seiji Nagahara, Yokohama (JP)

(73) Assignee: NICHIA CORPORATION, Anan-shi (JP)

( * ) Notice: Subject to any disclaimer, the term of this patent is extended or adjusted under 35 U.S.C. 154(b) by 62 days.

(21) Appl. No.: 14/449,047

(22) Filed: Jul. 31, 2014

(65) Prior Publication Data

US 2015/0036106 A1 Feb. 5, 2015

(30) Foreign Application Priority Data

Jul. 31, 2013 (JP) .................. 2013-159880

(51) Int. Cl.
*G03B 21/20* (2006.01)
*H04N 9/31* (2006.01)
(Continued)

(52) U.S. Cl.
CPC ......... *G03B 21/204* (2013.01); *G03B 21/208* (2013.01); *G03B 33/08* (2013.01); *H04N 9/3114* (2013.01); *H04N 9/3158* (2013.01); *H04N 9/3161* (2013.01); *G02B 26/008* (2013.01); *H01S 5/005* (2013.01)

(58) Field of Classification Search
CPC ........ G03B 21/14; G03B 21/20; G03B 21/00; F21V 13/02; F21V 14/08; H04N 6/31
See application file for complete search history.

(56) References Cited

U.S. PATENT DOCUMENTS

2006/0227442 A1* 10/2006 Hsu .................. G03B 33/08
359/892
2010/0245776 A1* 9/2010 Yamamoto ........... G03B 21/204
353/38
(Continued)

FOREIGN PATENT DOCUMENTS

JP 2004-341105 A 12/2004
JP 2008-002518 A 1/2008
(Continued)

*Primary Examiner* — Toan Ton
*Assistant Examiner* — Danell L Owens
(74) *Attorney, Agent, or Firm* — Foley & Lardner LLP

(57) ABSTRACT

A light source unit, includes: a semiconductor laser device that emits laser light; a wheel substrate that has a light entering surface and a light exiting surface, and includes one or more phosphor-containing regions each contains one or more kinds of phosphor converts the laser light into light having a wavelength different from a wavelength of the laser light; a motor that faces the light entering surface of the wheel substrate, wherein the motor has a rotational shaft that supports a center of the wheel substrate, and is configured to rotate the wheel substrate; and a condensing optical system that faces the light exiting surface of the wheel substrate, and condenses light that has exited from the light exiting surface of the wheel substrate, the condensing optical system comprising a lens having an optical axis that substantially coincides with a reference axis of the light that has exited from the light exiting surface of the wheel substrate, wherein the lens is sized to cover the center of the wheel substrate.

12 Claims, 13 Drawing Sheets

(51) Int. Cl.
*G03B 33/08* (2006.01)
*G02B 26/00* (2006.01)
*H01S 5/00* (2006.01)

(56) References Cited

U.S. PATENT DOCUMENTS

| | | | |
|---|---|---|---|
| 2010/0328625 | A1 | 12/2010 | Miyazaki et al. |
| 2010/0328632 | A1* | 12/2010 | Kurosaki ............ G03B 21/204 |
| | | | 353/98 |
| 2012/0092624 | A1 | 4/2012 | Oiwa et al. |
| 2013/0027671 | A1 | 1/2013 | Miyazaki |
| 2013/0088471 | A1* | 4/2013 | Kitano ................ H04N 9/3114 |
| | | | 345/208 |

FOREIGN PATENT DOCUMENTS

| | | | |
|---|---|---|---|
| JP | 4204942 | B2 | 1/2009 |
| JP | 2011-013313 | A | 1/2011 |
| JP | 2011-013316 | A | 1/2011 |
| JP | 2011-065770 | A | 3/2011 |
| JP | 2012-013897 | A | 1/2012 |
| JP | 2012-037638 | A | 2/2012 |
| JP | 2012-068647 | A | 4/2012 |
| JP | 2012-088451 | A | 5/2012 |
| JP | 2012-190698 | A | 10/2012 |
| JP | 2012190698 | A * | 10/2012 |
| JP | 2013-011652 | A | 1/2013 |
| JP | 2013-047793 | A | 3/2013 |
| JP | 2013-109283 | A | 6/2013 |
| WO | WO-2012/002254 | A1 | 1/2012 |

* cited by examiner

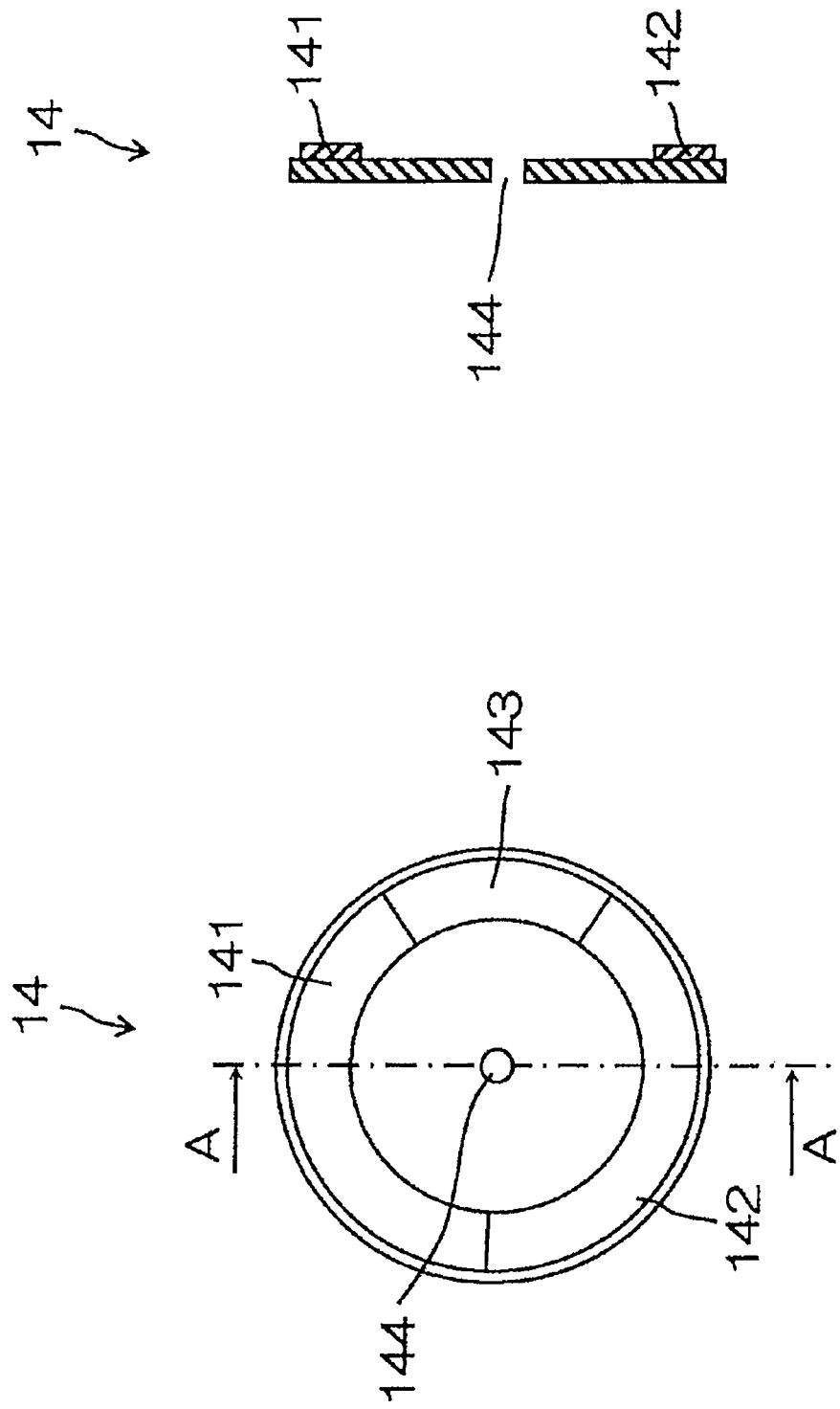

LIGHT SOURCE UNIT AND OPTICAL ENGINE

CROSS REFERENCE TO RELATED APPLICATIONS

This application claims the benefit of Japanese Priority Patent Application JP2013-159880 filed on Jul. 31, 2013, the entire contents of which are incorporated herein by reference.

BACKGROUND

The disclosure relates to a light source unit and an optical engine that condense, with the use of a lens, light emitted from a phosphor in a transmissive phosphor wheel.

A discharged-based light source such as an ultrahigh pressure mercury lamp or a xenon lamp has been used for a projector. On the other hand, a configuration has been proposed in which light-emitting diodes or semiconductor lasers are used for a light source in consideration of superiority in decreased power consumption and a reduced environmental burden (for example, see Japanese Unexamined Patent Application Publication Nos. 2008-002518, 2012-088451, 2011-013313, 2011-065770, and 2004-341105).

In particular, high expectation is placed, as a high luminance projector that takes safety into consideration, on a hybrid projector in which a semiconductor laser device and a phosphor are used in combination.

For example, JP 2011-013313A discloses a projector including: the blue semiconductor laser device that generates blue light; a phosphor wheel that includes a phosphor region absorbing blue light and emitting green light, a phosphor region absorbing blue light and emitting red light, and a transmission region having a light diffusion effect; a motor that rotates the phosphor wheel in a circumferential direction; and a condenser lens group that is disposed in the vicinity of both front and back surfaces of the phosphor wheel.

In the projector disclosed in JP 2011-013313A, the blue light emitted from the blue semiconductor laser device is condensed and is applied to the phosphor wheel with the use of the condenser lens group disposed on the front side of the phosphor wheel, while rotating the phosphor wheel with the use of the motor. Further, the condenser lens group disposed on the back side of the phosphor wheel receives the red light and the green light that have been emitted from the respective phosphor regions in the phosphor wheel and the blue light that has passed through the transmission region, to thereby generate illumination light.

Also, JP 2004-341105A discloses a phosphor wheel that is coated with a phosphor absorbing blue-violet light and emitting blue light, a phosphor absorbing blue-violet light and emitting green light, and a phosphor absorbing blue-violet light and emitting red light.

SUMMARY

When light emitted from a phosphor is used for part or all of illumination, it is necessary to efficiently condense the emitted light in order to achieve high luminance. On the other hand, since the light emitted from the phosphor is diffused in a wide range as scattered light, it is necessary to increase a diameter of a lens and to make a distance between the lens and the phosphor as small as possible in order to efficiently condense the light emitted from the phosphor by the lens.

However, for example, in the projector disclosed in JP 2011-013313A, a motor is disposed on a diffused light exiting side of the wheel substrate. Also, the phosphor wheel is connected to the motor body by a rotation shaft of the motor and a fixing member. Accordingly, the lens may interfere with the motor body or the fixing member when the lens is brought close to the phosphor wheel. Therefore, it is necessary that the diameter of the lens be decreased in order to prevent the lens from interfering with the motor body or the fixing member. On the other hand, it is necessary to increase the diameter of the phosphor wheel itself in order to increase the diameter of the lens. As a result, the light source as a whole becomes larger.

In JP 2011-065770A, a lens (a D-cut lens) in which a portion physically interfering with the motor is cut off is used as a lens that condenses diffused light transmitted through a region that diffuses and transmits light from the excitation light source in the phosphor wheel in the light source unit. JP 2011-065770A proposes a method of efficiently receiving the transmitted diffused light by increasing the diameter of the lens (the D-cut lens) in a radius direction of the phosphor wheel. However, the lens has to be cut off to some extent in order to bring the lens closer to the phosphor, since the motor is disposed on a transmitted diffused light exiting side of the phosphor wheel in the light source unit disclosed in JP 2011-065770A. Therefore, the area for receiving the light is reduced, and the transmitted diffused light is still not sufficiently condensed.

In the existing light source units described above, the motor and the lens condensing light such as fluorescence are disposed on the same side of the wheel substrate, and the lens therefore needs to be formed in a size that prevents the lens from interfering with the motor. Hence, in the existing light source units, the size of the lens condensing light such as fluorescence is limited due to the size, the position, etc. of the motor. Therefore, the diffused light such as fluorescence is not sufficiently condensed. As a result, efficiency in utilizing light is degraded.

It is desirable to provide a light source unit and an optical engine capable of efficiently condensing light emitted from a phosphor.

A light source unit according to an embodiment of the invention includes: a semiconductor laser device that emits laser light; a wheel substrate that has a light entering surface and a light exiting surface, and including one or more phosphor-containing regions each contains one or more phosphor converts the laser light into light having a wavelength different from a wavelength of the laser light; a motor that faces the light entering surface of the wheel substrate, has a rotation shaft that supports center of the wheel substrate, and is configured to rotate the wheel substrate; and a condensing optical system that faces the light exiting surface of the wheel substrate, and condenses light that has exited from the light exiting surface of the wheel substrate, the condensing optical system including a lens having an optical axis that substantially coincides with a reference axis of the light that has exited from the light exiting surface of the wheel substrate, wherein the lens is sized to cover the center of the wheel substrate.

An optical engine according to an embodiment of the invention includes: the light source unit described above; a light modulator that modulates light emitted from the light source unit; and a projection optical system that projects light modulated by the light modulator.

According to the light source unit or the optical engine of the above-described embodiment of the invention, it is possible to prevent the lens condensing the emission light (the fluorescence) exited from the wheel substrate from interfering with the motor, by disposing the lens to face the light exiting surface of the wheel substrate, in other words, on the opposite side of the wheel substrate from the motor. Therefore, it is not necessary to design the size of the lens taking into consideration the size, the position, etc. of the motor, making it possible to allow the lens to have a larger size. Specifically, it is possible to increase the area for receiving the light by allowing the lens to have the size that covers the center of the wheel substrate, and therefore to efficiently condense the light emitted from the phosphor. As a result, according to the light source unit or the optical engine of the above-described embodiment of the invention, it is possible to improve efficiency in utilizing light.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments and, together with the specification, serve to explain the principles of the technology.

DETAILED DESCRIPTION

[First Embodiment]

Figure 1A:
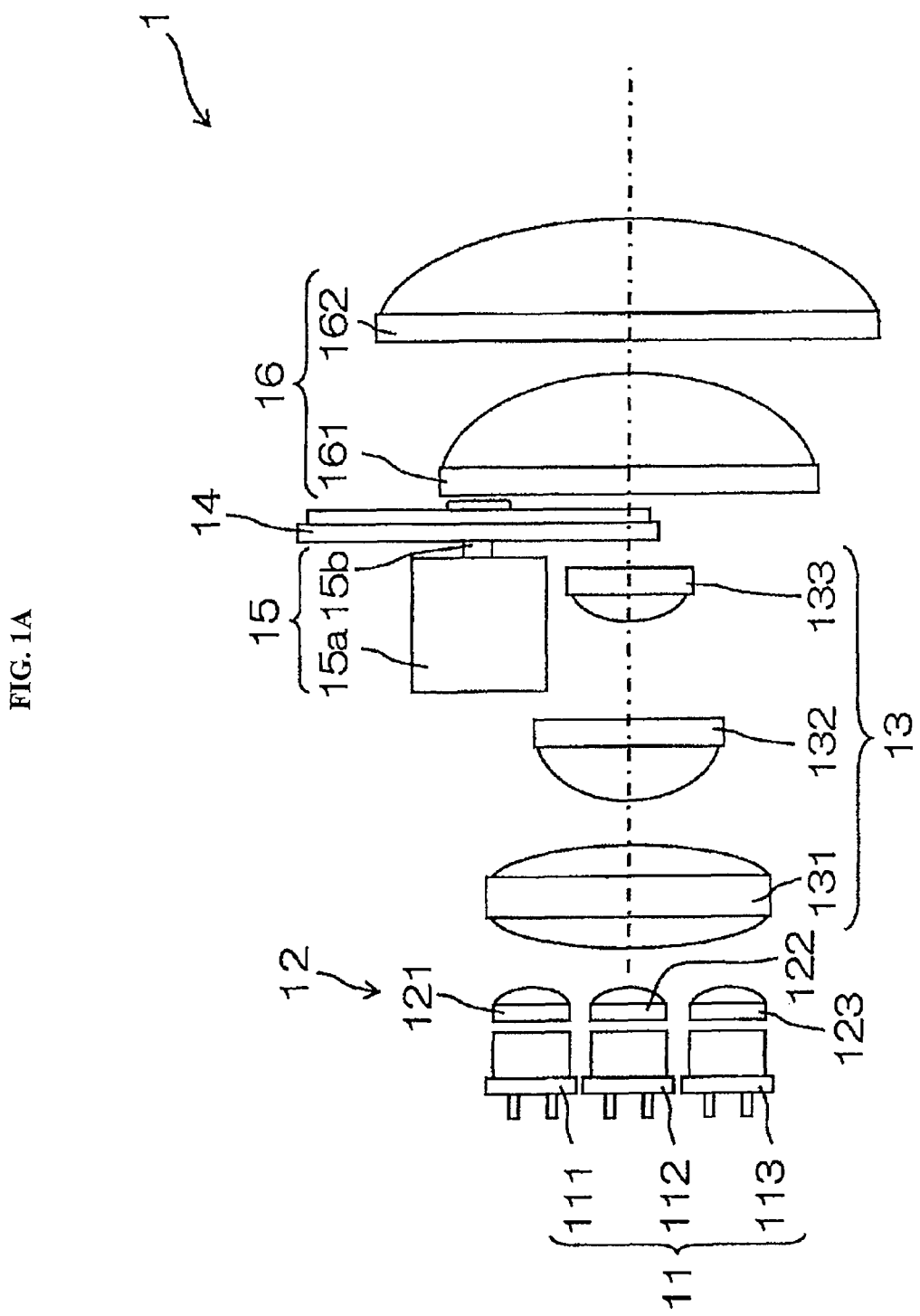
FIG. 1A is a schematic diagram illustrating a general configuration of a light source unit according to a first embodiment of the invention, and FIG. 1B includes a front view of a wheel substrate in the light source unit illustrated in FIG. 1A and a cross-sectional view of an end surface taken along line A-A.

Description is provided below of light source units according to some example embodiments of the invention with reference to the accompanying drawings. The drawings referred to in the description below schematically illustrate some example embodiments of the invention. Therefore, scale, a positional relationship, etc. of elements may be exaggerated, or part of the elements may be omitted, in some cases. Further, wherever possible, the same names and reference numerals are used in the description to refer the same or like elements, and where appropriate, such elements will not be described in detail.

Description is provided below of a configuration of a light source unit 1 according to a first embodiment of the invention referring to FIGS. 1A to 2D.

As illustrated in FIG. 1A, the light source unit 1 may include a semiconductor laser device 11, a collimator lens 12, an irradiation optical system 13, a wheel substrate 14, a motor 15, and a condensing optical system 16.

In this embodiment, the semiconductor laser device 11 may include three semiconductor laser elements 111, 112, and 113 that each emit blue laser light having a wavelength band from about 400 nm to about 480 nm. It is to be noted that the terms "forward (front)" and "backward (rear)" used in the following description are based on a traveling direction of light emitted from the semiconductor laser device 11.

The collimator lens 12 may be disposed at a forward position of the semiconductor laser device 11, and may be configured to convert diverging light emitted from the semiconductor laser device 11 into parallel light and to allow the parallel light to exit therefrom. The collimator lens 12 may include collimator lens elements of the number corresponding to the number of the semiconductor laser elements in the semiconductor laser device 11. In this embodiment, the collimator lens 12 may include collimator lens elements 121, 122, and 123 in correspondence with the semiconductor laser elements 111, 112, and 113, respectively. The collimator lens element 121 may be so disposed that an optical axis thereof coincides with a reference axis of blue light emitted from the semiconductor laser element 111. The collimator lens element 122 may be so disposed that an optical axis thereof coincides with a reference axis of blue light emitted from the semiconductor laser element 112. The collimator lens element 123 may be so disposed that an optical axis thereof coincides with a reference axis of blue light emitted from the semiconductor laser element 113. It is to be noted that, in the accompanying drawings, an optical axis of the parallel light exited from the collimator lens 12 is illustrated as a dashed-dotted line.

The irradiation optical system 13 may be disposed at a forward position of the collimator lens elements 121, 122, and 123, and may be configured to condense the parallel light that has exited from the collimator lens elements 121, 122, and 123 and to apply the condensed light onto a light entering surface of the wheel substrate 14. The irradiation optical system 13 may include one or more lenses. As illustrated in FIG. 1A, in this embodiment, the irradiation optical system 13 may include one biconvex lens 131 and two plano-convex lenses 132 and 133. The biconvex lens 131, the plano-convex lens 132, and the plano-convex lens 133 may be disposed in order in the traveling direction of light.

The biconvex lens 131 has a size (an effective diameter) that allows the biconvex lens 131 to receive substantially all of the emission light from all of the collimator lens elements 121, 122, and 123, and allows substantially all of the emission light to be closer to an optical axis of the biconvex lens 131. The plano-convex lens 132 allows light that has passed through the biconvex lens 131 to be further closer to an optical axis of the plane-convex lens 132. The plano-convex lens 133 applies light that has passed through the plano-convex lens 132 onto the wheel substrate 14. The plano-convex lens 133 has a diameter in a size that prevents the plano-convex lens 133 from interfering with the motor 15 disposed nearby.

As illustrated in FIG. 1B, the wheel substrate 14 may be a circular member made of a transparent material such as quartz or glass. The wheel substrate 14 may include three regions in a circumferential direction on a surface thereof opposite from the irradiation optical system 13 as illustrated in FIG. 1B. The three regions may be a red phosphor region 141, a green phosphor region 142, and a transmission region (a passing-through region) 143. The wheel substrate 14 may have an insertion hole 144 in the center for inserting a rotation shaft 15b of the motor 15 therethrough. The red phosphor region 141, the green phosphor region 142, and the transmission region 143 may be provided in a region that is outside the center of the wheel substrate 14 in the circumferential direction. In this example, the terms "red phosphor region" and "green phosphor region" are used for description; however, these regions provided with respective phosphors may be collectively referred to as "phosphor region" or "phosphor-containing region" in some cases.

The red phosphor region 141 is a region provided with a phosphor that may be excited by blue light emitted from the semiconductor laser device 11 and condensed to be applied thereon by the irradiation optical system 13, and thereby emits red light. The green phosphor region 142 is a region provided with a phosphor that may be excited by the blue light emitted from the semiconductor laser device 11 and condensed to be applied thereon by the irradiation optical system 13, and thereby emits green light. In this embodiment, the transmission region 143 may be configured as a void that corresponds to a predetermined amount of portion, in the wheel substrate 14, that has been cut out. The transmission region 143 is a region that may transmit the blue light emitted from the semiconductor laser device 11 and condensed to be applied thereon by the irradiation optical system 13.

As illustrated in FIG. 1B, in this embodiment, the red phosphor region 141 and the green phosphor region 142 may have the surface areas that are substantially the same and are larger than the surface area of the transmission region 143 in the wheel substrate 14. However, a range of each of the regions may be changed as appropriate. Moreover, in this embodiment, the red phosphor provided in the red phosphor region 141 and the green phosphor provided in the green phosphor region 142 in the wheel substrate 14 may have substantially the same thickness.

In this embodiment, "light entering surface" of the wheel substrate 14 refers to a surface, of the wheel substrate 14, that faces a light exiting surface of the plano-convex lens 133 in the irradiation optical system 13. "Light exiting surface" of the wheel substrate 14 refers to a surface on the light exiting side of the red phosphor region 141, a surface on the light exiting side of the green phosphor region 142, and a surface on the light exiting side of the transmission region 143 in the wheel substrate 14. It is to be noted that the surface on the light exiting side of the transmission region 143 is located at a backward position compared to the surfaces on the light exiting side of the red phosphor region 141 and the green phosphor region 142, since the transmission region 143 is the void formed by cutting out the predetermined amount of portion of a plate surface of the wheel substrate 14. Hereinafter, the wording "light exiting surface of the wheel substrate 14" refers to a plane that is located at a position of the surfaces on the light exiting side of the red phosphor region 141 and the green phosphor region 142.

Figure 2A:
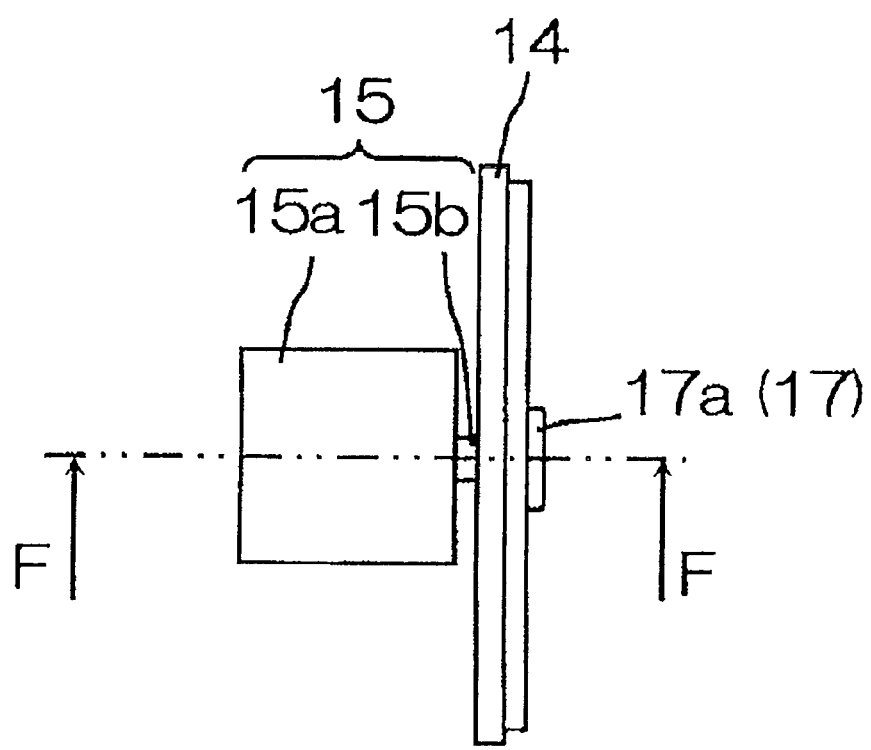
FIG. 2A is a side view of the wheel substrate and a motor when a fastener is used as a fixing member.

As illustrated in FIGS. 1A and 2A, the motor 15 includes a motor body 15a and the rotation shaft 15b that protrudes from the center of the motor body 15a. The motor 15 is disposed to face the light entering surface of the wheel substrate 14 and supports the center of the wheel substrate 14 by the rotation shaft 15b to rotate the wheel substrate 14.

The motor body 15a rotates the rotation shaft 15b. The rotation shaft 15b is rotated with the power supplied from the motor body 15a in a state in which the wheel substrate 14 is fixed to a tip portion of the rotation shaft 15b, and thereby rotates the wheel substrate 14 in a circumferential direction. The motor 15 is disposed on the semiconductor laser device 11 side of the wheel substrate 14.

Description is now provided below of a method of fixing the wheel substrate 14 to the rotation shaft 15b of the motor 15.

Figure 2B:
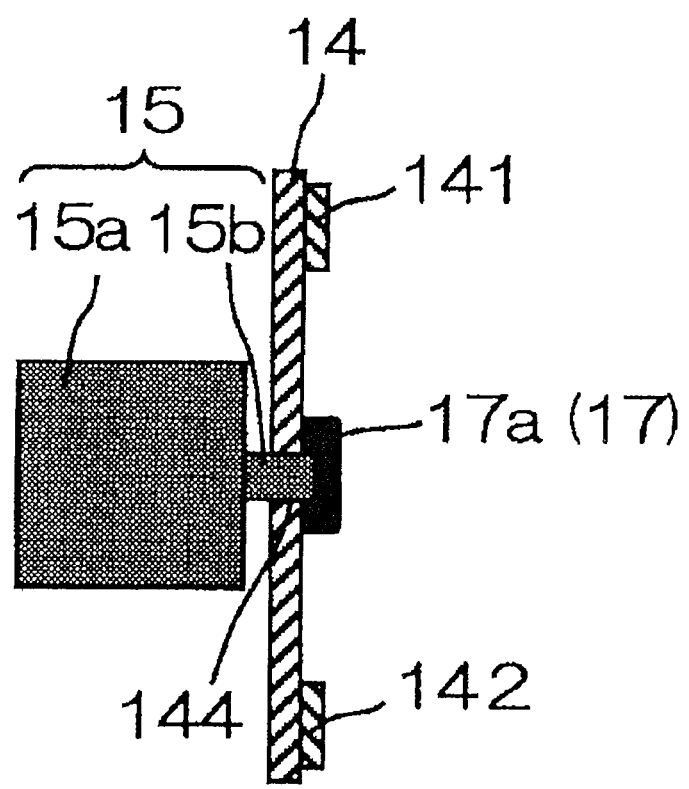
FIG. 2B is a cross-sectional view of an end surface taken along line F-F, of the wheel substrate and the motor illustrated in FIG. 2A.
Figure 2C:
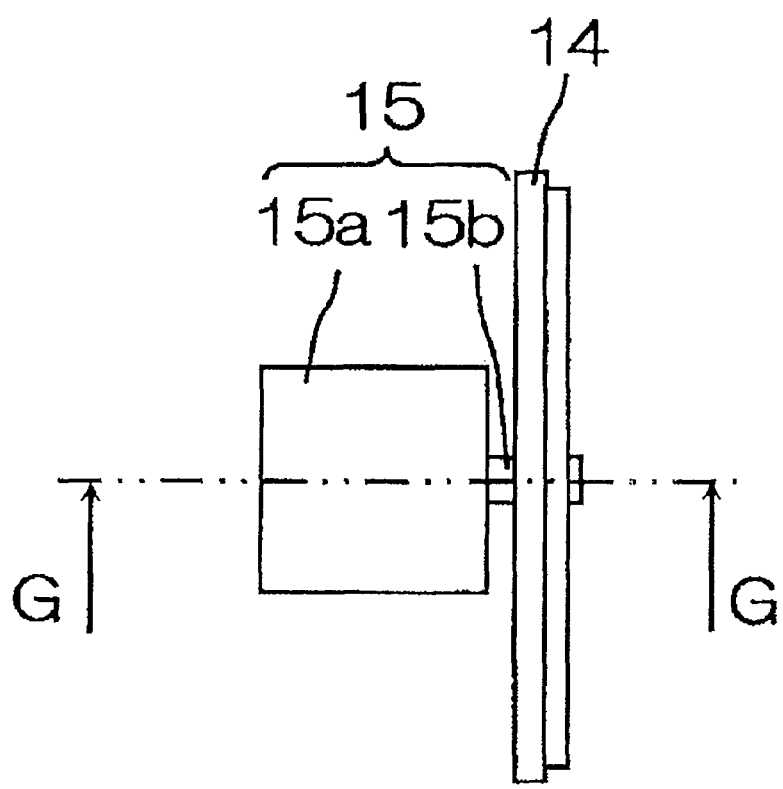
FIG. 2C is a side view of the wheel substrate and the motor when an adhesive is used as the fixing member.
Figure 2D:
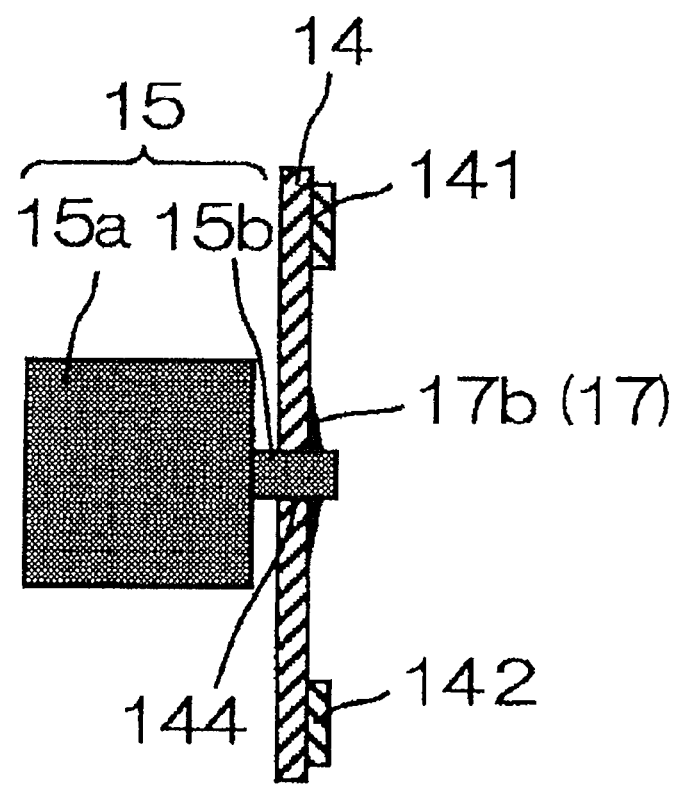
FIG. 2D is a cross-sectional view of an end surface taken along line G-G, of the wheel substrate and the motor illustrated in FIG. 2C.

As illustrated in FIGS. 2B and 2D, the rotation shaft 15b may be inserted through the insertion hole 144 from the light entering surface of the wheel substrate 14. A fixing member 17 may be attached to the tip portion of the rotation shaft 15b that protrudes from the light exiting surface of the wheel substrate 14, and the wheel substrate 14 may be thus fixed to the rotation shaft 15b. Examples of the fixing member 17 may include a fastener 17a illustrated in FIG. 2B and an adhesive 17b illustrated in FIG. 2D. It is to be noted that FIGS. 1A and 2A each illustrate an example where the fastener 17a illustrated in FIG. 2B is used as the fixing member 17.

The fastener 17a illustrated in FIGS. 2A and 2B may be made, for example, of metal or resin, and may be configured of a thick circular member that has a diameter larger than a diameter of the rotation shaft 15b. The fastener 17a may have, in the center of a surface thereof, a concave portion that has a circle planar shape that has a diameter substantially the same as the diameter of the rotation shaft 15b. The concave portion of the fastener 17a may be brought to fit from the light exiting surface of the wheel substrate 14 into the tip portion of the rotation shaft 15b. Thus, the wheel substrate 14 may be fixed to the rotation shaft 15b so as not to fall out from the rotation shaft 15b. Alternatively, for example, thread grooves may be formed on the tip portion of the rotation shaft 15b and on an inner wall of the concave portion of the fastener 17a, and the thread groove of the concave portion of the fastener 17a may be engaged with the thread groove of the tip portion of the rotation shaft 15b to fix the wheel substrate 14 to the rotation shaft 15b.

FIGS. 2C and 2D each illustrate an embodiment in which an adhesive is used as the fixing member 17. As illustrated in FIG. 2D, when an adhesive 17b is used as the fixing member 17, the adhesive 17b may be applied over the tip portion of the rotation shaft 15b that protrudes from the light exiting surface of the wheel substrate 14 and over the surface of the wheel substrate 14 around the tip portion of the rotation shaft 15b, and the applied adhesive 17b may be cured. Thus, the wheel substrate 14 may be fixed to the rotation shaft 15b so as not to fall out from the rotation shaft 15b.

The rotation shaft 15b may have a length that allows the motor body 15a not to be in contact with the wheel substrate 14 in a state in which the wheel substrate 14 is fixed to the tip portion of the rotation shaft 15b. "Length" of the rotation shaft 15b herein refers to a length of a portion, of the rotation shaft 15b, that protrudes from the motor body 15a. In other words, an appropriate gap is formed between the motor body 15a and the light entering surface of the wheel substrate 14 in the state in which the wheel substrate 14 is fixed to the tip portion of the rotation shaft 15b. Therefore, interference between the wheel substrate 14 and the motor body 15a is prevented, allowing a rotation operation of the wheel substrate 14 not to be prevented by the motor body 15a.

The condensing optical system 16 is configured to condense diffused light (fluorescence) exited from the light exiting surface of the wheel substrate 14. The condensing optical system 16 may include a plurality of lenses. As illustrated in FIG. 1A, the condensing optical system 16 may include two plano-convex lenses 161 and 162 in this embodiment. The plano-convex lenses 161 and 162 may be disposed in order in the traveling direction of light, and may each have an optical axis that substantially coincides with a reference axis of the fluorescence exited from the wheel substrate 14. It is to be noted that the reference axis of the fluorescence from the wheel substrate 14 substantially coincides with the reference axis of the emission light from the semiconductor laser device 11. The plano-convex lenses 161 and 162 each may have a planar surface that faces toward the light entering side (toward the wheel substrate 14) and have a convex surface that faces toward the light condensing side.

The plano-convex lens 161 may be configured to receive the light exited from the light exiting surface of the wheel substrate 14, and allow the received light to exit therefrom toward the plano-convex lens 162. The plano-convex lens 162 may receive the light exited from the plano-convex lens 161, allow the received light to be brought closer to an optical axis of the plano-convex lens 161, and allow such light to exit therefrom to a multiplexing system (which is not illustrated).

In this embodiment, the plano-convex lens 161 that is disposed closest, in the condensing optical system 16, to the light exiting surface of the wheel substrate 14 has a size (a diameter) that covers the center of the wheel substrate 14 when viewed from the light exiting surface side of the wheel substrate 14. In other words, the center of the wheel substrate 14 is hidden by the plano-convex lens 161 when viewed from the light exiting surface side of the wheel substrate 14.

It is to be noted that, when the condensing optical system 16 includes two or more lenses, the lens disposed closest to the light exiting surface of the wheel substrate 14 has the size that covers the center of the wheel substrate 14.

By thus increasing the diameter of the plano-convex lens 161 that is disposed closest to the light exiting surface of the wheel substrate 14 out of the lenses included in the condensing optical system 16, an optically-effective range (the light receiving area) is increased. This makes it possible to efficiently condense, as effective light, the diffused light that has exited from the light exiting surface of the wheel substrate 14. Hence, efficiency in utilizing the diffused light is improved compared to a case of using a lens that is limited in size so as to prevent physical interference with a motor.

Further, the lens (in this embodiment, the plan-convex lens 161) disposed closest to the wheel substrate 14 may be preferably disposed as close as possible to the light exiting surface of the wheel substrate 14 to an extent that the rotation operation of the wheel substrate 14 is not prevented. Thus, the diffused light exited from the light exiting surface of the wheel substrate 14 is condensed more efficiently, and effective light is increased accordingly.

In this embodiment, the fixing member 17 or the tip portion of the rotation shaft 15b protrudes forward compared to the light exiting surface of the wheel substrate 14 on the light exiting surface side of the wheel substrate 14 as described above with reference to FIGS. 2B and 2D. Therefore, the plano-convex lens 161 may be preferably disposed as close as possible to the light exiting surface of the wheel substrate 14 to an extent that the plano-convex lens 161 does not interfere with the fixing member 17 or the tip portion of the rotation shaft 15b.

Description is now provided of an operation of the light source unit 1 configured as described above with reference to FIGS. 1A to 2D.

In the light source unit 1, the semiconductor laser elements 111, 112, and 113 generate blue laser light (blue light) and apply the generated blue light onto the corresponding collimator lens elements 121, 122, and 123, respectively. In the light source unit 1, the collimator lens elements 121, 122, and 123 receive the blue light from the corresponding semiconductor laser elements 111, 112, and 113, convert the received blue light into parallel light, and allow the parallel light to exit therefrom toward the irradiation optical system 13.

Further, in the light source unit 1, the biconvex lens 131, the plano-convex lens 132, and the plano-convex lens 133 in the irradiation optical system 13 condense the parallel light that has exited from the collimator lens elements 121, 122, and 123, to apply the condensed light onto the light entering surface of the wheel substrate 14.

At this time, in the light source unit 1, the wheel substrate 14 is rotated through the rotation shaft 15b by the power generated in the motor body 15a of the motor 15, whereby, the light entering surface of one of the red phosphor region 141, the green phosphor region 142, and the transmission region. 143 in the wheel substrate 14 is brought to face the light exiting surface of the irradiation optical system 13. In other words, the light entering surface of one of the red phosphor region 141, the green phosphor region 142, and the transmission region 143 in the wheel substrate 14 is located on the optical axis of the blue light derived from the semiconductor laser device 11.

In the wheel substrate 14, when the red phosphor region 141 receives the blue light emitted from the semiconductor laser elements 111, 112, and 113 and condensed to be applied thereon by the irradiation optical system 13, the phosphor in the red phosphor region 141 is excited by the entered blue light to generate red-wavelength-band light, which is emitted from the light exiting surface of the wheel substrate 14. Also, in the wheel substrate 14, when the green phosphor region 142 receives the blue light emitted from the semiconductor laser elements 111, 112, and 113 and condensed to be applied thereon by the irradiation optical system 13, the phosphor in the green phosphor region 142 is excited by the entered blue light to generate green-wavelength-band light, which is emitted from the light exiting surface of the wheel substrate 14. Also, in the wheel substrate 14, when the transmission region 143 receives the blue light emitted from the semiconductor laser elements 111, 112, and 113 and condensed to be applied thereon by the irradiation optical system 13, the transmission region 143 allows the entered blue light to pass therethrough as it is and allows such blue light to exit from the light exiting surface of the wheel substrate 14.

In the light source unit 1, the plano-convex lens 161 in the condensing optical system 16 receives and condenses the light exited from the light exiting surface of the wheel substrate 14, and allows the condensed light to exit to the plano-convex lens 162. In the light source unit 1, the plano-convex lens 162 in the condensing optical system 16 receives and condenses the light exited from the plano-convex lens 161, and allows the condensed light to exit to the multiplexing system (which is not illustrated) or the like. The light source unit 1 may operate as described above.

In the light source unit 1 according to the first embodiment described above, the following functions and effects are achieved.

That is, in the light source unit 1, since the motor 15 is disposed on the semiconductor laser device 11 side of the wheel substrate 14, the size (the diameter) of the lens included in the condensing optical system 16 is not limited by factors such as the arrangement and the size of the motor 15.

Moreover, in the light source unit 1, the plano-convex lens 161 disposed closest to the light exiting surface of the wheel substrate 14, out of the lenses included in the condensing optical system 16, has the size that covers the center of the wheel substrate 14. Therefore, in the light source unit 1, as effective light, the diffused light exited from the light exiting surface of the wheel substrate 14 is condensed efficiently, with the use of the plano-convex lens 161 in the condensing optical system 16. As a result, efficiency in utilizing light is improved according to the light source unit 1.

As described above, according to the light source unit 1, the light entering surface of the plano-convex lens 161 disposed closest to the light exiting surface of the wheel substrate 14 is allowed to be made larger. Therefore, the fluorescence is condensed more efficiently without increasing the diameter of the wheel substrate 14, compared with cases such as a case of using a lens having a diameter that is so decreased that the lens does not physically interfere with the motor body 15a, or a case of using a lens in which a portion physically interfering with the motor body 15a is cut out. Accordingly, the efficiency in utilizing fluorescence is improved while decreasing the size of the unit.

Moreover, in the light source unit 1, the red phosphor region 141, the green phosphor region 142, and the transmission region 143 may be provided side-by-side in the circumferential direction of the wheel substrate 14. Therefore, fluorescence of red, green, and blue may be generated in a time-divisional manner by rotating the wheel substrate 14 by the motor 15 and thereby switching the region that receives the blue light from the semiconductor laser elements 111, 112, and 113.

[Second Embodiment]

Figure 3A:
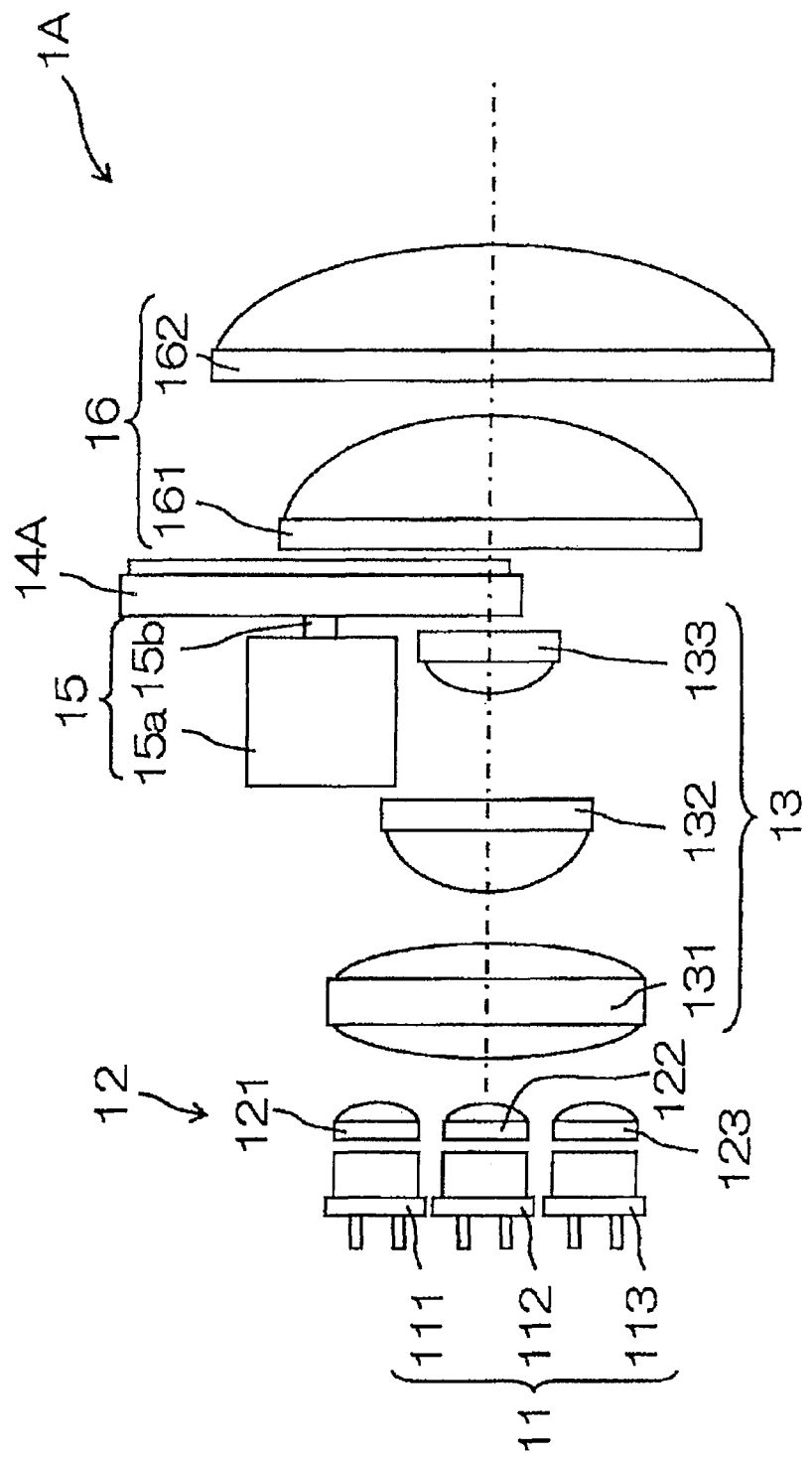
FIG. 3A is a schematic diagram illustrating a general configuration of a light source unit according to a second embodiment of the invention, FIG. 3B includes a front view of a wheel substrate illustrated in FIG. 3A and a cross-sectional view of an end surface taken along line B-B, and FIG. 3C includes a side view of the wheel substrate and a motor in the light source unit illustrated in FIG. 3A and a cross-sectional view of an end surface taken along line C-C.
Figure 3B:
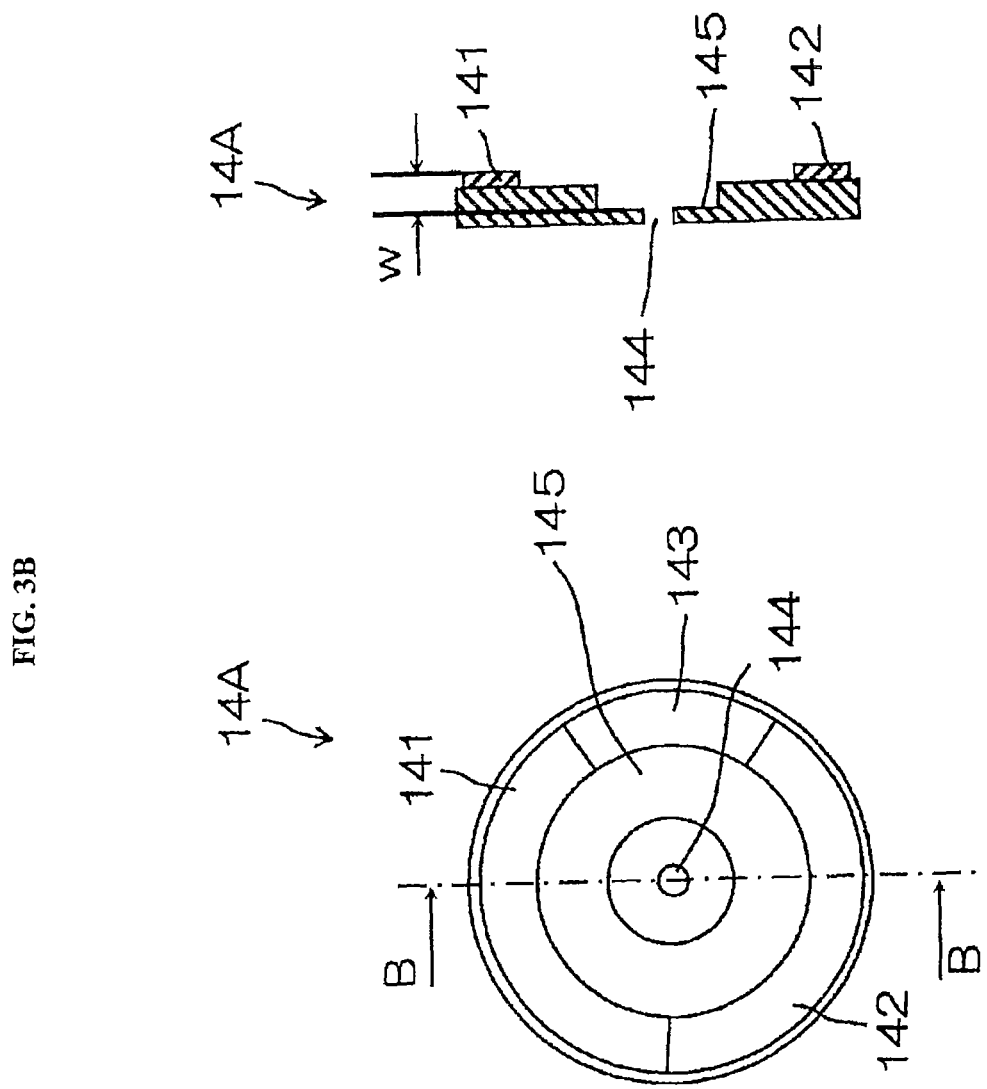
Figure 3C:
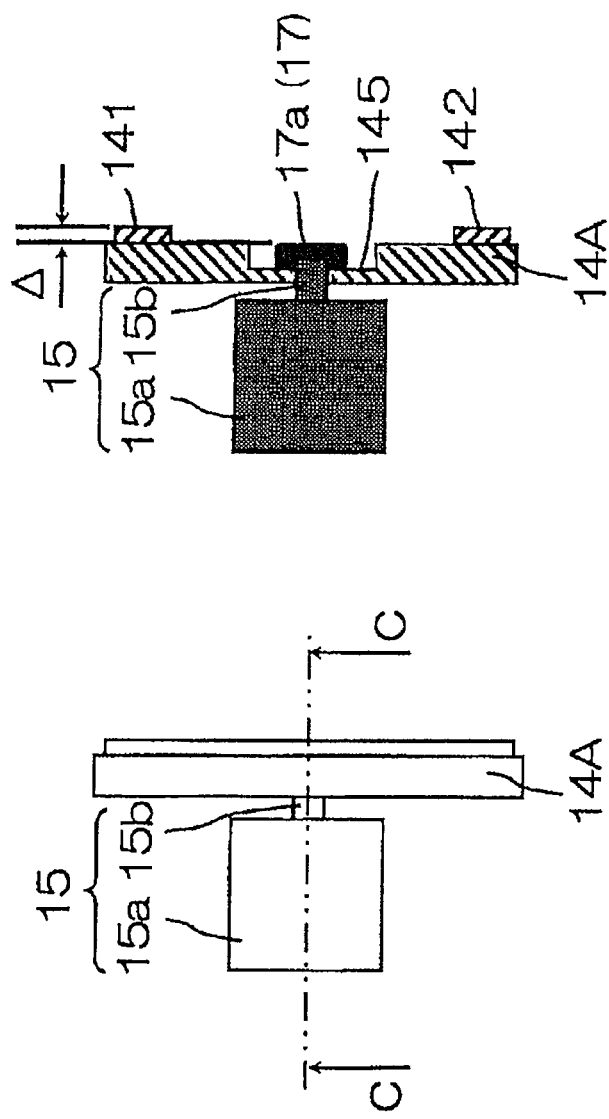

Next, description is provided of a light source unit 1A according to a second embodiment of the invention with reference to FIGS. 3A to 3C.

As illustrated in FIG. 3A, the light source unit 1A may include the semiconductor laser device 11, the collimator lens 12, the irradiation optical system 13, a wheel substrate 14A, the motor 15, and the condensing optical system 16. A configuration of the light source unit 1A illustrated in FIG. 3A except for the wheel substrate 14A is similar to the configuration of the light source unit 1 illustrated in FIG. 1A, and therefore will not be further described below.

As illustrated in FIG. 3B, the wheel substrate 14A may be a circular member. On the light exiting surface side of the wheel substrate 14A, a region around the center of the wheel substrate 14A and within a predetermined radius is recessed toward the light entering surface side in a concave shape, and thereby a recessed portion that has a circle planar shape is formed. In this embodiment, the recessed portion that has the circle planar shape is referred to as a concave portion 145. The predetermined radius may be set appropriately to an extent that allows the concave portion 145 to be located in an inner region, in the surface of the wheel substrate 14A, compared to the red phosphor region 141, the green phosphor region 142, and the transmission region 143.

As illustrated in FIG. 3B, the wheel substrate 14A has the insertion hole 144 in the center (in the center of the concave portion 145) for inserting the rotation shaft 15b of the motor 15 therethrough from the light entering surface side to the light exiting surface side of the wheel substrate 14A. As illustrated in FIG. 3B, a depth (a distance) from the light exiting surface of the wheel substrate 14A to a surface of the concave portion 145 is represented by "W" in the description below. In this embodiment, a surface (the light exiting surface) of the red phosphor provided in the red phosphor region 141 and a surface of the green phosphor provided in the green phosphor region 142 correspond to "light exiting surface of the wheel substrate". When a diffuser is provided in the transmission region 143, a surface of the diffuser also corresponds to "light exiting surface of the wheel substrate".

FIG. 3C illustrates a cross-sectional view, taken along line C-C, of the motor 15 and the wheel substrate 14A illustrated in FIG. 3A. As illustrated in FIG. 3C, the light exiting surface of the wheel substrate 14A may be a foremost surface in a state in which the wheel substrate 14A is fixed to the rotation shaft 15b of the motor 15.

"Foremost surface" refers to a surface that is located at a most-forward position in the traveling direction of light on the light exiting surface side of the wheel substrate 14A in the state in which the wheel substrate 14A is fixed to the rotation shaft 15b of the motor 15.

In this embodiment, a tip surface of the fixing member 17 (in this embodiment, the fastener 17a) attached to the tip portion of the rotation shaft 15b may be located at a backward position of the light exiting surface of the wheel substrate 14A in the state in which the wheel substrate 14A is fixed to the rotation shaft 15b of the motor 15.

As illustrated in FIG. 3C, a portion, of the wheel substrate 14A, provided with the concave portion 145 may have a thickness that is smaller than a thickness of other portion therearound by a depth of the concave portion 145. Therefore, a bottom surface of the concave portion 145 is located at a position lower than (recessed from) the surface of other portion in the wheel substrate 14A. When the fixing member 17 (the fastener 17a) is disposed inside the concave portion 145 formed in such a manner, a height of the fastener 17a is canceled by the depth of the concave portion 145. Consequently, as illustrated in FIG. 3C, the tip surface of the fastener 17a is located at a backward position of the light exiting surface of the wheel substrate 14A in a state in which the wheel substrate 14A is fixed to the rotation shaft 15b of the motor 15.

As illustrated in FIG. 3C, a height from the bottom surface of the concave portion 145 to the tip surface of the fastener 17a is lower by Δ than a height from the bottom surface of the concave portion 145 to the light exiting surface of the wheel substrate 14A. The depth W from the light exiting surface of the wheel substrate 14A to the bottom surface of the concave portion 145 may be set to a value that allows the light exiting surface of the wheel substrate 14A to be the foremost surface in the state in which the wheel substrate 14A is fixed to the rotation shaft 15b of the motor 15 by the fixing member 17. It is to be noted that, although FIG. 3C illustrates an embodiment where the fastener 17a is used as the fixing member 17, the width W may also be so set likewise that the light exiting surface of the wheel substrate 14A serves as the foremost surface in a case where an adhesive is used as the fixing member 17 as illustrated in FIG. 2C.

As described above, the surface of the fixing member 17 (in this embodiment, the fastener 17a) is located at a backward position of the light exiting surface of the wheel substrate 14A in the traveling direction of light. As a result, the lens in the condensing optical system 16 is disposed further closer to the light exiting surface of the wheel substrate 14A.

Even when the lens included in the condensing optical system 16 is disposed close to the light exiting surface of the wheel substrate 14A, the lens does not interfere with the fixing member 17, and the rotation operation of the wheel substrate 14A is therefore not prevented.

The condensing optical system 16 may be preferably so disposed that a distance between the light exiting surface of the wheel substrate 14A and the light entering surface of the lens disposed closest to the light exiting surface of the wheel substrate 14A out of the plurality of lenses included in the condensing optical system 16 is 2 mm or less. In this embodiment, the lens disposed closest to the light exiting surface of the wheel substrate 14A out of the lenses included in the condensing optical system 16 is the plano-convex lens 161.

Thus, the diffused light is condensed efficiently by the plano-convex lens 161, and effective light is therefore increased. In addition thereto, the wheel substrate 14A is prevented from interfering with the plano-convex lens 161, even when vibration generated in the motor body 15a of the motor 15 is transferred to the wheel substrate 14A via the rotation shaft 15b and the wheel substrate 14A is thereby shaken in an optical axis direction while rotating.

The light source unit 1A described above may operate in a manner similar to that of the light source unit 1 described in the first embodiment.

In the light source unit 1A according to the second embodiment, functions and effects as follows are achieved in addition to the functions and effects of the light source unit 1 described in the first embodiment.

In the light source unit 1A, the wheel substrate 14A has the concave portion 145. Therefore, the tip portion of the rotation shaft 15b is substantially coplanar with the light exiting surface, or is recessed from the light exiting surface toward the light entering surface in a state where the wheel substrate 14A is fixed to the rotation shaft 15b of the motor 15. Accordingly, the light exiting surface of the wheel substrate 14A serves as the foremost surface. As a result, the lens (the plano-convex lens 161) included in the condensing optical system 16 is disposed closer to the light exiting surface of the wheel substrate 14A in the light source unit 1A.

Moreover, in the light source unit 1A, the diffused light exited from the light exiting surface of the wheel substrate 14A is condensed efficiently by the plano-convex lens 161 disposed closest to the light exiting surface of the wheel substrate 14A. This further increases effective light. Hence, efficiency in utilizing light is further improved in the light source unit 1A.

[Modification]

Figure 4A:
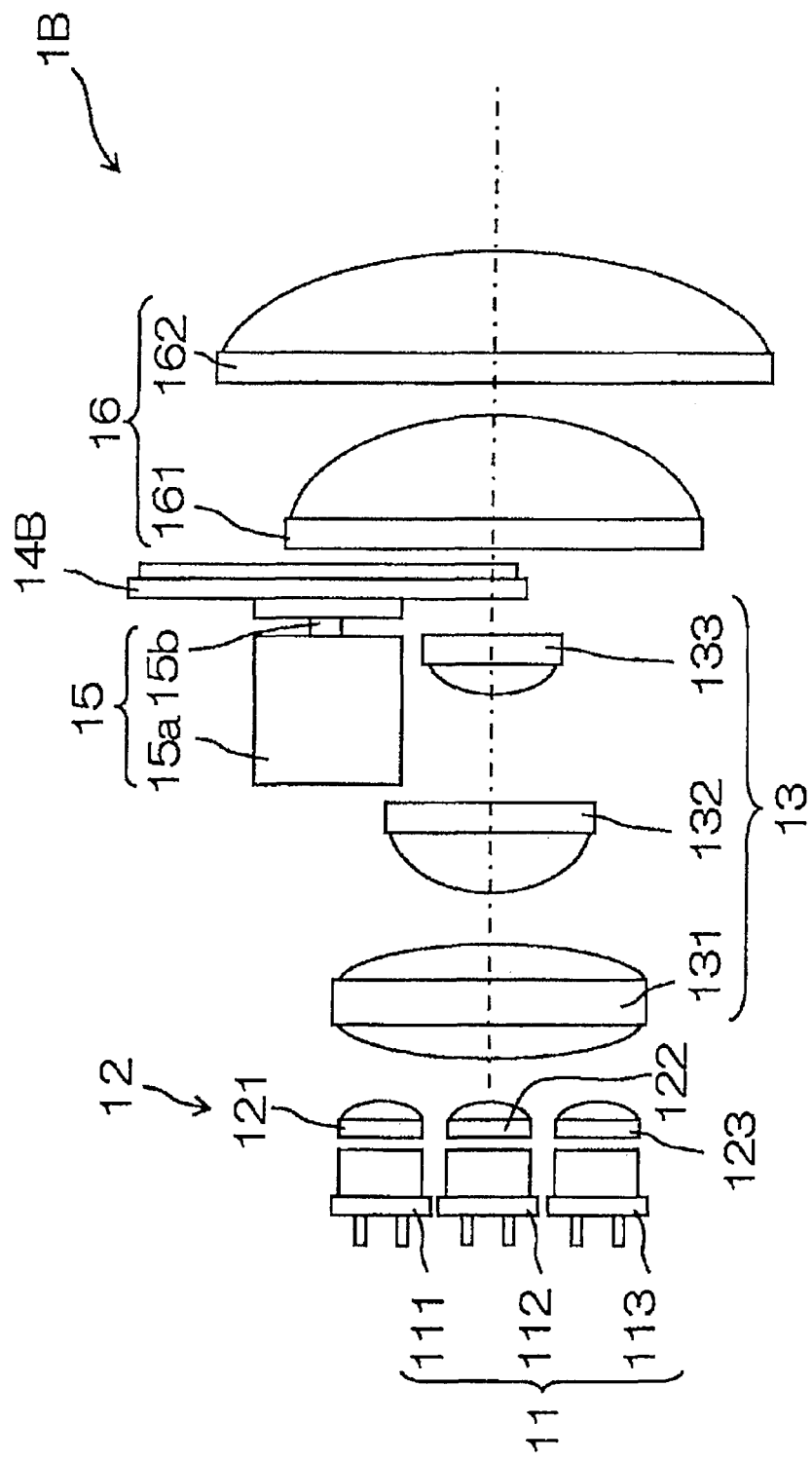
FIG. 4A is a schematic diagram illustrating a general configuration of a light source unit according to a modification of the second embodiment of the invention, and FIG. 4B includes a front view of a wheel substrate illustrated in FIG. 4A and a cross-sectional view of an end surface taken along line E-E.
Figure 4B:
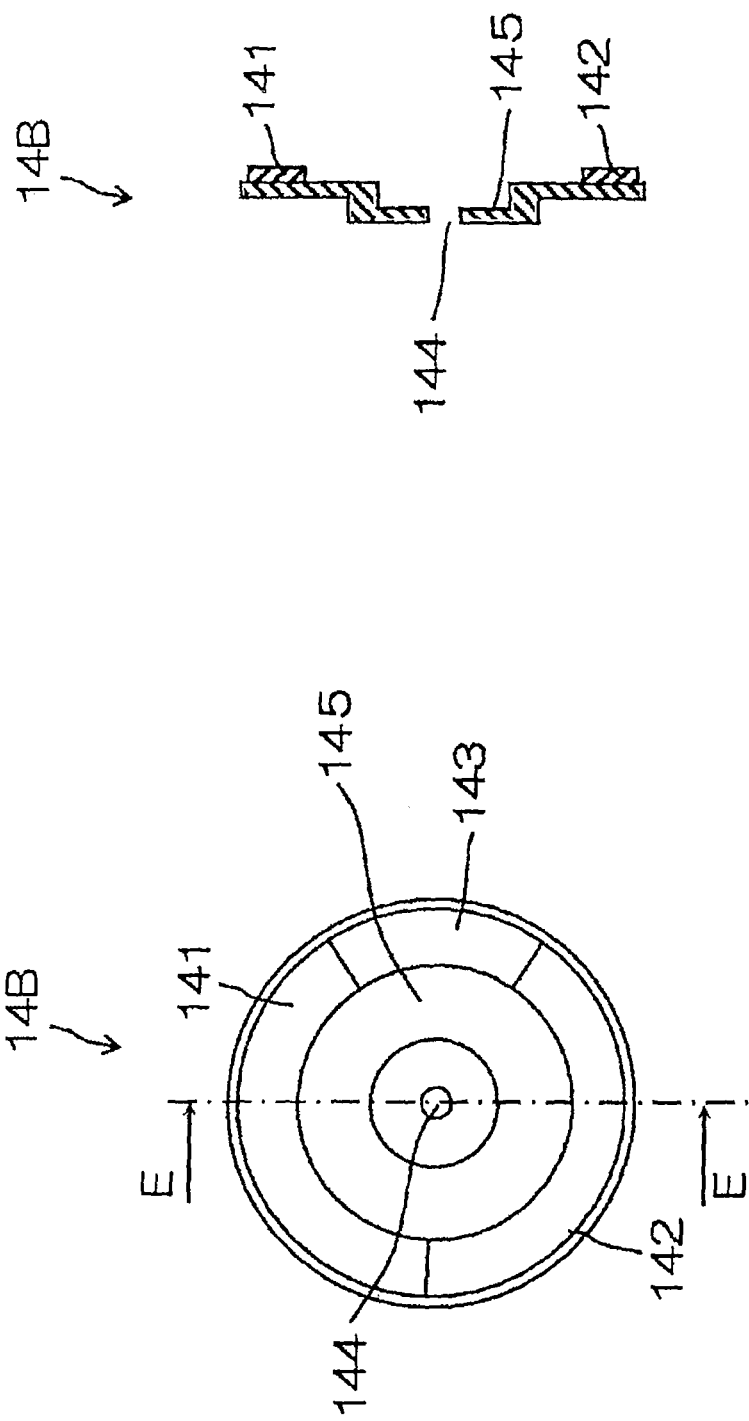

Next, description is provided, with reference to FIGS. 4A and 4B, of a light source unit 1B that includes a wheel substrate 14B, as a modification of the wheel substrate 14A in the light source unit 1A according to the second embodiment.

It is to be noted that the light source unit 1B illustrated in FIGS. 4A and 4B is different from the light source unit 1A according to the second embodiment illustrated in FIGS. 3A to 3C only in that the light source unit 1B includes the wheel substrate 14B instead of the wheel substrate 14A. Therefore, only a configuration of the wheel substrate 14B in the light source unit 1B is described below.

In the wheel substrate 14A in the light source unit 1A according to the second embodiment illustrated in FIG. 3B, a central portion of one surface side (the light exiting surface side) of the circular member having a uniform thickness is recessed by a predetermined amount toward the other surface side (the light entering surface side) to form the concave portion 145. In such a configuration, a portion around the concave portion 145 in the wheel substrate 14A, i.e., a portion provided with the phosphor region and the transmission region becomes thick in order to secure the depth of the concave portion 145 as illustrated in FIG. 3B. For example, even when the wheel substrate 14A is made of a transparent material such as quartz, increase in thickness may cause light applied from the irradiation optical system 13 to be absorbed in some degrees, which in turn may reduce an amount of light that enters the phosphor region and the transmission region.

To address such circumstances, as illustrated in FIG. 4B, the thickness of the portion around the concave portion 145 is reduced in the wheel substrate 14B in the light source unit 1B according to the modification. Here, the thickness of the portion around the concave portion 145 in the wheel substrate 14B is reduced by removing a predetermined amount thereof on the light entering surface side as illustrated in FIG. 4B. The thickness of the portion around the concave portion 145 in the wheel substrate 14B may be set as appropriate. For example, the thickness of the portion around the concave portion 145 may be substantially the same as the thickness of the wheel substrate 14A that has a uniform thickness in the entire region thereof as illustrated in FIGS. 1A and 1B.

In the wheel substrate 14B, a predetermined amount on the light entering surface side of the portion around the concave portion 145 is removed as illustrated in FIG. 4B. Therefore, positions, in the traveling direction of light, of the light exiting surface and of the bottom surface of the concave portion 145 are not changed from those in the wheel substrate 14A illustrated in FIG. 3B. Accordingly, a depth W from the light exiting surface of the wheel substrate 14B to the bottom surface of the concave portion 145 is similar to that in the wheel substrate 14A illustrated in FIG. 3B.

In the light source unit 1B according to the modification described above, the thickness of the portion provided with the phosphor region and the transmission region is reduced in the wheel substrate 14B. This suppresses absorption of light by the wheel substrate 14B. As a result, it is possible to prevent reduction in an amount of light that enters the phosphor region and the transmission region in the wheel substrate 14B in the light source unit 1B.

[Simulation]

Figure 5:
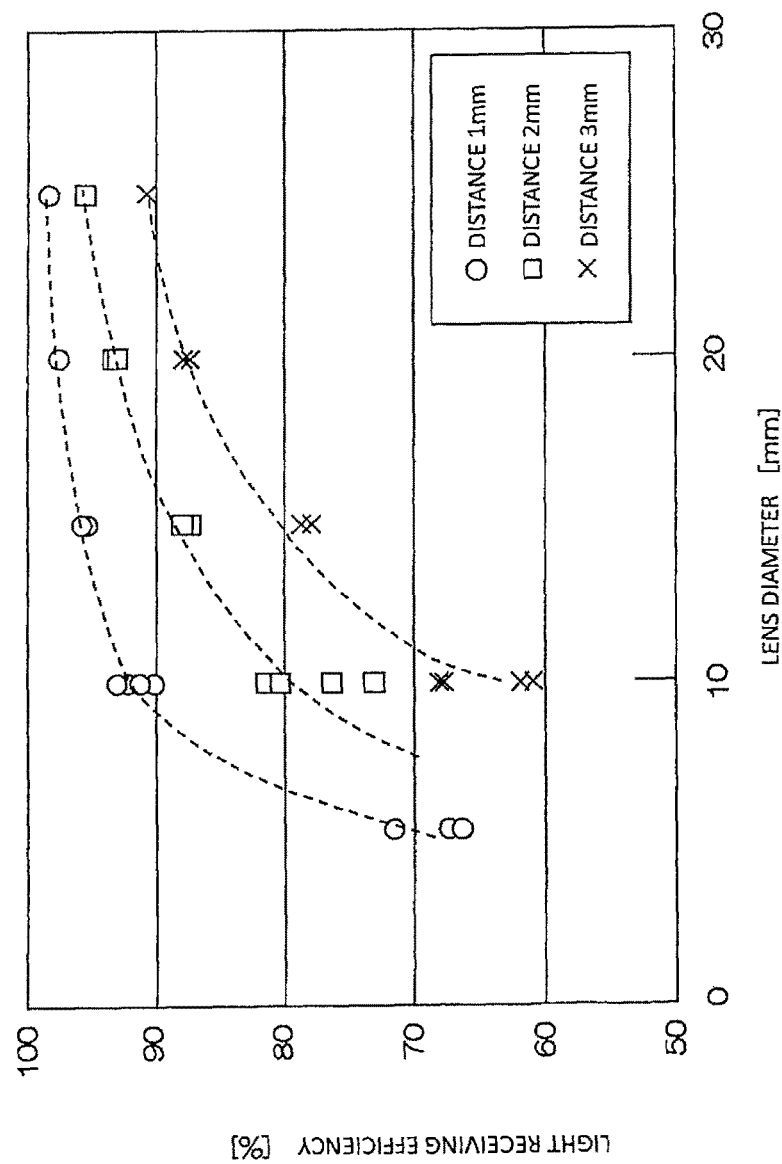
FIG. 5 is a graph showing a result of a simulation examining fluorescence receiving efficiency with a varying diameter of a lens and with a varying distance between a phosphor and a first surface of the lens in a configuration in which light (fluorescence) emitted from the phosphor is received with the use of one plano-covex lens.

Next, referring to FIG. 5, description is provided of a simulation of a case where fluorescence exited from the light exiting surface of the wheel substrate is condensed by one plano-convex lens (one condenser lens) in the light source unit. By the simulation, variation in light receiving efficiency [%] of the plano-convex lens was investigated, where a lens diameter [mm] of the plano-convex lens and a distance D [mm] between the light exiting surface of the wheel substrate and a first surface of the plano-convex lens were varied. It is to be noted that a surface, of the plano-convex lens, on the light entering side was assumed to be the first surface, and a surface thereof on the light exiting side was assumed to be a second surface. In this simulation, a planar surface of the plano-convex lens was assumed to be the first surface.

Specifically, in the simulation, the variation in light receiving efficiency of the plano-convex lens was investigated, where the distance D between the light exiting surface of the wheel substrate and the first surface of the plano-convex lens was varied by 1 mm from 1 mm to 3 mm, and the diameter of the plano-convex lens was varied by 5 mm from 10 mm to 25 mm. It is to be noted that the simulation was made also to investigate the light receiving efficiency of the plano-convex lens, where the diameter of the plano-convex lens was 5 mm only when the distance D between the light exiting surface of the wheel substrate and the first surface of the plano-convex lens was 1 mm.

FIG. 5 shows a graph of a result of the simulation. A vertical axis of the graph shown in FIG. 5 represents the light receiving efficiency [%], and a horizontal axis thereof represents the lens diameter [mm]. As shown in FIG. 5, the light receiving efficiency was increased as the diameter of the plano-convex lens increased and as the distance D between the light exiting surface of the wheel substrate and the first surface of the plano-convex surface decreased.

First, description is provided of the variation in the light receiving efficiency in accordance with the variation in the diameter of the plano-convex lens. For example, when paying attention to the variation in the light receiving efficiency in accordance with the variation in the diameter of the plano-convex lens where the distance D between the light exiting surface of the wheel substrate and the first surface of the plano-convex lens was 1 mm in the graph shown in FIG. 5, the light receiving efficiency was around 70% when the diameter of the plano-convex lens was 5 mm as shown in FIG. 5. However, the light receiving efficiency increased to about 90% when the diameter of the plano-covex lens was 10 mm, and further increased as the diameter of the plano-convex lens was varied to 15 mm, to 20 mm, and to 25 mm.

Next, description is provided of the variation in the light receiving efficiency in accordance with the variation in the distance D between the light exiting surface of the wheel substrate and the first surface of the plano-convex lens. In the graph shown in FIG. 5, three curves denoted by dashed lines show, in order from the curve on the top, simulation results of cases where the distances D were 1 mm, 2 mm, and 3 mm. As can be seen from FIG. 5, regardless of the diameter of the plano-convex lens, the light receiving efficiency was the highest when the distance D was 1 mm followed by the distance D of 2 mm and the distance D of 3 mm in order. In particular, in the case where the distance D was 2 mm, the light receiving efficiency of 80% or higher was obtainable even when the diameter of the lens was as small as 10 mm. Moreover, by setting the distance D to 1 mm, the light receiving efficiency remarkably increased when the lens diameter was varied from 5 mm to 10 mm, and light receiving efficiency of 90% or higher was achieved even when the lens diameter was as small as 10 mm.

For example, when paying attention to the variation in the light receiving efficiency in accordance with the distance D between the light exiting surface of the wheel substrate and the first surface of the plano-convex lens when the diameter of the plano-convex lens was 15 mm in the graph shown in FIG. 5, the light receiving efficiency was lower than 80% when the distance D was 3 mm as can be seen from FIG. 5. However, the light receiving efficiency increased up to almost 90% when the distance D was varied to 2 mm, and further increased up to 95% or higher when the distance D was varied to 1 mm.

As described above, it was confirmed that the most favorable light receiving efficiency was achieved when the distance D between the light exiting surface of the wheel substrate and the first surface of the plano-convex lens was shortest and the diameter of the plano-convex lens was largest in the conditions set in this simulation.

Accordingly, it has been confirmed that efficiency in utilizing light is improved by adopting a configuration in which the distance between the light exiting surface of the wheel substrate and the first surface (the light entering surface) of the plano-convex lens is as short as possible and the diameter of the plano-convex lens is allowed to be increased, as in the light source units according to the first and second embodiments described above.

[Optical Engine]

Figure 6:
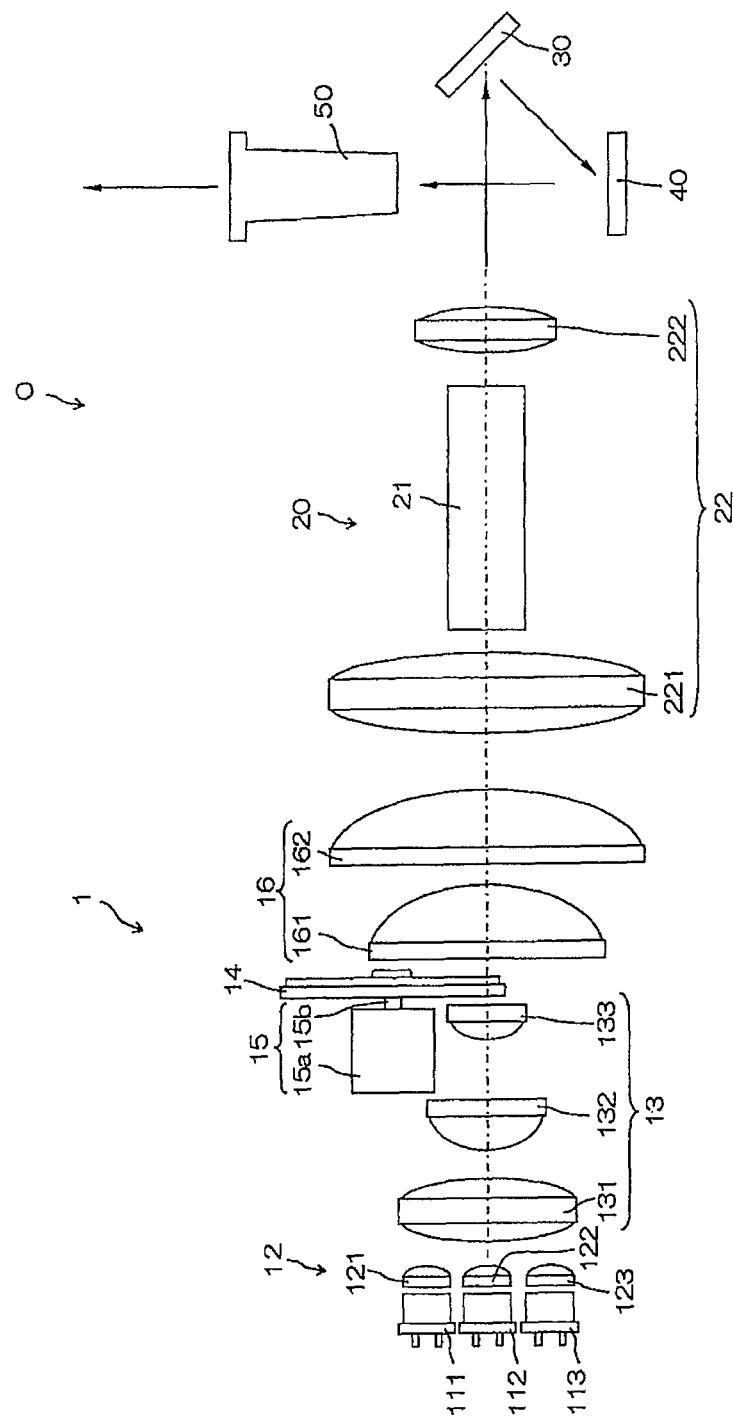
FIG. 6 is a schematic diagram illustrating an optical engine that includes the light source unit according to the first embodiment of the invention.

Next, description is provided of an optical engine that includes the light source unit according to any of the embodiments described above with reference to FIG. 6. As one example, description is provided below of an optical engine O that includes the light source unit 1 according to the first embodiment as illustrated in FIG. 6. The optical engine O may be used, for example, as an optical engine in a projector.

As illustrated in FIG. 6, the optical engine O may include the light source unit 1 illustrated in FIGS. 1A and 1B, a multiplexing system 20, a mirror 30, a light modulator 40, and a projection optical system 50.

It is to be noted that the terms "forward" and "backward" used in the following description are based on the traveling direction of the light emitted from the semiconductor laser device 11 in the light source unit 1.

Each component in the optical engine O is described below. It is to be noted that the configuration of the light source unit 1 is as described above in the first embodiment, and therefore will not be further described.

The multiplexing system 20 may be disposed at a forward position of the light source unit 1. The multiplexing system 20 may include a multiplexing device 21 and a condensing optical system 22 disposed at forward and backward positions of the multiplexing device 21. In this embodiment, the condensing optical system 22 includes a biconvex lens 221 disposed at the forward position of the multiplexing device 21 and a biconvex lens 222 disposed at the backward position of the multiplexing device 21.

The multiplexing device 21 may multiplex (performs optical path synthesis and color composition on) received light that has been exited from the light exiting surfaces of the red phosphor region 141, the green phosphor region 142, and the transmission region 143 in the wheel substrate 14 in the light source unit 1 and has been condensed by the condensing optical system 16, and may allow light intensity of such light to be spatially uniform. Examples of the multiplexing device 21 may include a rod integrator and a light pipe.

The biconvex lens 221 may receive the light condensed by the condensing optical system 16 (the plano-covex lenses 161 and 162) in the light source unit 1, and reduce a beam diameter of the received light to allow the light having the reduced beam diameter to exit therefrom to the multiplexing device 21. The biconvex lens 222 may receive the multiplexed light that has been multiplexed in the multiplexing device 21, and exit therefrom to the mirror 30.

The mirror 30 may be disposed at a forward position of the biconvex lens 222 included in the multiplexing system 20, and have a reflective surface that faces toward the light modulator 40. The mirror 30 may be configured to totally reflect the multiplexed light exited from the biconvex lens 222 in the multiplexing system 20 and to allow the totally-reflected light to exit to the light modulator 40. In the embodiment illustrated in FIG. 6, the mirror 30 may rotate, by 45°, an optical axis of the multiplexed light received from the biconvex lens 222 in the multiplexing system 20 and allow the received light to reflect therefrom toward the light modulator 40.

The light modulator 40 may include, for example, a display controller and a modulation device. The modulation device may be a micro mirror, a liquid crystal device, or the like. The light modulator 40 may receive the light from the mirror 30, and reflect (or transmit) the received light while modulating the received light by the modulator device on the basis of an image signal supplied from the display controller, to thereby allow image light to exit therefrom.

The projection optical system 50 may receive the image light exited from the light modulator 40, and project (in an enlarged manner) the received image light, for example, to a display panel, a screen, or the like.

An operation of the foregoing optical engine O is described, with reference to FIG. 6 where appropriate.

In the optical engine O, the semiconductor laser elements 111, 112, and 113 in the light source unit 1 generate blue light, and emit the generated blue light to the corresponding collimator lens elements 121, 122, and 123, respectively. In the optical engine O, the collimator lens elements 121, 122, and 123 each convert the received blue light into parallel light, and allow the parallel light to exit therefrom to the biconvex lens 131 in the irradiation optical system 13.

In the optical engine O, the irradiation optical system 13 (the biconvex lens 131 and the plano-convex lenses 132 and 133) in the light source unit 1 condenses the parallel light from the collimator lens elements 121, 122, and 123, and applies the condensed light to the light entering surface of the wheel substrate 14.

Subsequently, in the optical engine O, the motor 15 in the light source unit 1 rotates the wheel substrate 14. Thus, the blue light emitted from the semiconductor laser elements 111, 112, and 113 and condensed by the irradiation optical system 13 enters one of the red phosphor region 141, the green phosphor region 142, and the transmission region 143.

In the optical engine O, the red phosphor region 141 in the wheel substrate 14 converts the received blue light to the red light. Similarly, the green phosphor region 142 in the wheel substrate 14 converts the received blue light to the green light. Further, the transmission region 143 in the wheel substrate 14 transmits the received blue light and allows the received blue light to exit therefrom as it is.

In the optical engine O, the condensing optical system 16 (the plano-convex lenses 161 and 162) in the light source unit 1 receives the red light, the green light, and the blue light exited from the red phosphor region 141, the green phosphor region 142, and the transmission region 143 in the wheel substrate 14, and exit therefrom to the multiplexing system 20.

In the optical engine O, the biconvex lens 221 in the multiplexing system 20 allows the red light, the green light, and the blue light to exit therefrom to the multiplexing device 21. In the optical engine O, the multiplexing device 21 in the multiplexing system 20 multiplexes the red light, the green light, and the blue light to generate multiplexed light that has spatially-uniform light intensity, and allows the multiplexed light to exit therefrom. Further, in the optical engine O, the biconvex lens 222 in the multiplexing system 20 allows the multiplexed light exited from the multiplexing device 21 to exit therefrom to the mirror 30.

In the optical engine O, the mirror 30 totally reflects the multiplexed light and allows the totally-reflected light to exit therefrom to the light modulator 40. In the optical engine O, the light modulator 40 converts the light received from the mirror 30 to an image light, and projects the image light to the projection optical system 50. In the optical engine O, the projection optical system 50 receives the image light and projects the received image light, for example, to an unillustrated display unit or the like.

The optical engine O may operate as described above.

According to the optical engine O described above, the light source unit 1 capable of efficiently condensing light is provided, and an amount of light projected from the projection optical system 50 to the screen or the like is therefore increased. Accordingly, an image having high luminance is displayed by the screen or the like that has received the light projected from the projection optical system 50. As described above, the amount of light used in the optical engine O is increased, and performance of the optical engine O is therefore improved.

It is to be noted that, although the optical engine O includes the light source unit 1 illustrated in FIGS. 1A and 1B in this embodiment, the optical engine O may include the light source unit 1A illustrated in FIGS. 3A to 3C or the light source unit 1B illustrated in FIGS. 4A and 4B instead of the light source unit 1.

Moreover, the mirror 30 is configured to totally reflect the multiplexed light exited from the multiplexing system 20 to allow the totally-reflected light to exit therefrom to the light modulator 40 in the optical engine O in this embodiment.

However, the multiplexed light exited from the multiplexing system 20 may be emitted directly to the light modulator 40 without providing the mirror 30.

Hereinabove, some embodiments of the invention have been described. However, the invention is not limited to the above-described embodiments.

The wheel substrate may include three regions that are the red phosphor region, the green phosphor region, and the transmission region in the above-described embodiments. However, the configuration of the wheel substrate is not limited thereto. Alternatively, the wheel substrate may include four or more regions, or may include one or two regions. Moreover, a blue phosphor region may be provided instead of the transmission region. Moreover, the transmission region may have a configuration in which a diffuser that diffuses incident light is provided on the light exiting surface side of the wheel substrate. The diffuser may be formed, for example, by performing a surface treatment on a surface of the wheel substrate, or by attaching some solid substance to the surface of the wheel substrate. Moreover, a phosphor that emits light having another wavelength band may be used instead of the red phosphor, the green phosphor, or both.

Moreover, in the above-described embodiments, the light source unit includes, as the excitation light source, three semiconductor laser elements that each generate blue light. However, the number of the semiconductor laser elements included in the semiconductor laser device 11 is not particularly limited. Therefore, the number of the semiconductor laser elements may be four or more, or may be one or two. When the semiconductor device includes a plurality of semiconductor laser elements, the amount of light that enters the wheel substrate is increased, and higher luminance is therefore achieved. Moreover, a semiconductor laser element that generates light having a particular wavelength other than blue light may be used as the semiconductor laser element.

Moreover, in the above-described embodiments, the light source unit includes the wheel substrate configured as a circular member. However, the type of the wheel substrate is not limited thereto, and the wheel substrate may be configured of a polygonal member.

Moreover, in the above-described embodiments, the irradiation optical system 13, the condensing optical system 16, and the condensing optical system 22 are configured of plano-convex lenses and biconvex lenses. However, the shape, the arrangement, and the number of the lenses are not particularly limited. Therefore, the irradiation optical system 13, the condensing optical system 16, and the condensing optical system 22 may each be configured of two lenses, or of one lens. The shape of the lens may be of a meniscus lens, of a plano-concave lens, or of a biconcave lens.

Furthermore, the invention encompasses any possible combination of some or all of the various embodiments described herein and incorporated herein.

It is possible to achieve at least one of the following configurations from the above-described example embodiments of the invention.

(1) A light source unit, including:
a semiconductor laser device that emits laser light;
a wheel substrate that has a light entering surface and a light exiting surface, and includes one or more phosphor-containing regions each contains one or more kinds of phosphor converts the laser light into light having a wavelength different from a wavelength of the laser light;
a motor that faces the light entering surface of the wheel substrate, wherein the motor has a rotational shaft that supports a center of the wheel substrate, and is configured to rotate the wheel substrate; and
a condensing optical system that faces the light exiting surface of the wheel substrate, and condenses light that has exited from the light exiting surface of the wheel substrate, the condensing optical system comprising a lens having an optical axis that substantially coincides with a reference axis of the light that has exited from the light exiting surface of the wheel substrate, wherein the lens is sized to cover the center of the wheel substrate.

(2) The light source unit according to (1), wherein the light exiting surface of the wheel substrate is an outermost surface in the wheel substrate on a light exiting side of the wheel substrate.

(3) The light source unit according to (1) or (2), further including a fixing member that attaches the wheel substrate to the rotation shaft, wherein a tip of the rotation shaft is coplanar with the light exiting surface, or is located closer to the light entering surface than to the light exiting surface.

(4) The light source unit according to any one of (1) to (3), wherein the wheel substrate further includes a transmission region through which the laser light from the semiconductor laser device passes, the transmission region is provided adjacent to the one or more phosphor-containing regions each contains one or more kinds of phosphor in a circumferential direction of the wheel substrate.

(5) The light source unit according to any one of (1) to (4), further including an irradiation optical system that faces the light entering surface of the wheel substrate, and directs the laser light from the semiconductor laser device onto the wheel substrate.

(6) The light source unit according to any one of (1) to (5), wherein the condensing optical system includes a plurality of lenses, and the lens of the plurality of lenses that is located closest to the wheel substrate is sized to cover the center of the wheel substrate.

(7) The light source unit according to any one of (1) to (6), wherein a distance between the light exiting surface of the wheel substrate and the light entering surface of the lens having the size that covers the center of the wheel substrate is about two millimeters or less.

(8) An optical engine, including:
the light source unit according to any one of (1) to (7);
a light modulator that modulates light emitted from the light source unit; and
a projection optical system that projects light modulated by the light modulator.

(1') A light source unit, including:
a semiconductor laser device configured to emit laser light;
a wheel substrate having a light entering surface and a light exiting surface, and including one or more kinds of phosphor region that is provided with a phosphor, the phosphor being configured to convert the laser light into another light having a wavelength different from a wavelength of the laser light;
a motor disposed to face the light entering surface of the wheel substrate, and having a rotation shaft that supports center of the wheel substrate, the motor being configured to rotate the wheel substrate; and
a condensing optical system disposed to face the light exiting surface of the wheel substrate, and configured to condense light that has exited from the light exiting surface of the wheel substrate, the condensing optical system including a lens, the lens having an optical axis that substantially coincides with a reference axis of the light that has exited from the light exiting surface of the wheel substrate, and having a size that covers the center of the wheel substrate.

(2') The light source unit according to (1'), wherein the light exiting surface of the wheel substrate is a foremost surface in the wheel substrate on a light exiting side of the wheel substrate.

(3') The light source unit according to (1') or (2'), further including a fixing member that attaches the wheel substrate to the rotation shaft, wherein
a tip of the rotation shaft is coplanar with the light exiting surface, or is located closer to the light entering surface than the light exiting surface.

(4') The light source unit according to any one of (1') to (3'), wherein the wheel substrate further includes a transmission region that allows the laser light from the semiconductor laser device to pass therethrough, the transmission region and the one or more kinds of phosphor region being provided side-by-side in a circumferential direction of the wheel substrate.

(5') The light source unit according to any one of (1') to (4'), further including an irradiation optical system disposed to face the light entering surface of the wheel substrate, and configured to apply the laser light from the semiconductor laser device onto the wheel substrate.

(6') The light source unit according to any one of (1') to (5'), wherein the condensing optical system includes a plurality of lenses, and
the lens having the size that covers the center of the wheel substrate is located closest, in the plurality of lenses, to the wheel substrate.

(7') The light source unit according to any one of (1') to (6'), wherein a distance between the light exiting surface of the wheel substrate and the light entering surface of the lens having the size that covers the center of the wheel substrate is about two millimeters or less.

(8') An optical engine, including:
the light source unit according to any one of (1') to (7');
a light modulator configured to modulate light emitted from the light source unit; and
a projection optical system configured to project light modulated by the light modulator.

Although the invention has been described in terms of exemplary embodiments, it is not limited thereto. It should be appreciated that variations may be made in the described embodiments by persons skilled in the art without departing from the scope of the invention as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations as used herein are defined as being largely but not necessarily wholly what is specified as understood by one of ordinary skill in the art. Also, the term "about", "approximately", or the like as used herein can allow for a degree of variability in a value or range. Moreover, no element or component in this disclosure is intended to be dedicated to the public regardless of whether the element or component is explicitly recited in the following claims.

What is claimed is:

1. A light source unit, comprising:
a semiconductor laser device configured to emit laser light;
a wheel substrate that has a light entering surface and a light exiting surface, and includes one or more phosphor-containing regions each containing one or more kinds of phosphor adapted to convert the laser light into light having a wavelength different from a wavelength of the laser light, wherein the light exiting surface of the wheel substrate is an outermost surface of the wheel substrate on a light exiting side of the wheel substrate;
a motor comprising a motor body that faces the light entering surface of the wheel substrate, and a rotation shaft that extends from the motor body and supports a center of the wheel substrate, the motor being configured to rotate the wheel substrate;
a condensing optical system configured to condense light that has exited from the light exiting surface of the wheel substrate, the condensing optical system comprising one or more first lenses that include:
a first plano-convex lens, which is a lens that is closest to the light exiting surface of the wheel substrate among the one or more first lenses, and includes:
a convex surface, and
a planar surface that faces the light exiting surface of the wheel substrate and covers the center of the wheel substrate,
wherein the first plano-convex lens has an optical axis that substantially coincides with a reference axis of the light that has exited from the light exiting surface of the wheel substrate;
an irradiation optical system that faces the light entering surface of the wheel substrate and is configured to direct the laser light from the semiconductor laser device onto the wheel substrate, the irradiation optical system comprising a plurality of second lenses that include:
a second plano-convex lens located laterally adjacent to the motor in a transverse direction of the light source unit, which is a direction transverse to an axial direction of the light source unit; and
a fastener that attaches the wheel substrate to the rotation shaft,
wherein a tip of the rotation shaft on a side of the rotation shaft farthest from the motor body is coplanar with the light exiting surface, or is located on a light entering surface side of the light exiting surface, and
wherein a tip of the fastener on a side of the fastener farthest from the motor body is located on a light entering surface side of the light exiting surface.

2. The light source unit according to claim 1, wherein the wheel substrate further includes a transmission region through which the laser light from the semiconductor laser device passes, the transmission region being provided adjacent to the one or more phosphor-containing regions in a circumferential direction of the wheel substrate.

3. The light source unit according to claim 1, wherein the condensing optical system comprises an additional lens.

4. The light source unit according to claim 3, wherein the additional lens is an additional plano-convex lens.

5. An optical engine, comprising:
the light source unit according to claim 1;
a light modulator configured to modulate light emitted from the light source unit; and
a projection optical system configured to project light modulated by the light modulator.

6. The optical engine according to claim 5, wherein the wheel substrate further includes a transmission region through which the laser light from the semiconductor laser device passes, the transmission region being provided adjacent to the one or more phosphor-containing regions in a circumferential direction of the wheel substrate.

7. The optical engine according to claim 5, wherein the condensing optical system comprises an additional lens.

8. The optical engine according to claim 7, wherein the additional lens is an additional plano-convex lens.

9. The light source unit according to claim 1, wherein a distance between the light exiting surface of the wheel substrate and a light entering surface of the first plano-convex lens is about two millimeters or less.

10. The light source unit according to claim 1, wherein the plurality of second lenses of the irradiation optical system further includes a third plano-convex lens located entirely on a semiconductor laser device side of the motor in an axial direction of the light source unit.

11. The light source unit according to claim 10, wherein the second plano-convex lens is configured to receive light directly from the third plano-convex lens.

12. The light source unit according to claim 1, wherein:
a concave portion is formed in the light exiting side of the wheel substrate, and
the fastener is located inside the concave portion.

* * * * *